United States Patent [19]
Tada et al.

[11] Patent Number: 5,391,506
[45] Date of Patent: Feb. 21, 1995

[54] MANUFACTURING METHOD FOR SEMICONDUCTOR DEVICES WITH SOURCE/DRAIN FORMED IN SUBSTRATE PROJECTION.

[75] Inventors: Yoshihide Tada; Hiroyasu Kunitomo, both of Chiba, Japan

[73] Assignee: Kawasaki Steel Corporation, Kobe, Japan

[21] Appl. No.: 9,747

[22] Filed: Jan. 27, 1993

[30] Foreign Application Priority Data

| Jan. 31, 1992 | [JP] | Japan | 4-017176 |
| Jan. 31, 1992 | [JP] | Japan | 4-017177 |
| Jun. 10, 1992 | [JP] | Japan | 4-150682 |

[51] Int. Cl.[6] .............. H01L 21/265; H01L 29/06; H01L 21/76
[52] U.S. Cl. .................. 437/41; 437/35; 437/36; 437/38
[58] Field of Search ............. 437/35, 36, 38, 41

[56] References Cited

U.S. PATENT DOCUMENTS

| 4,523,369 | 6/1985 | Nagakubo | 29/576 |
| 4,534,824 | 8/1985 | Chen | 156/628 |
| 4,756,793 | 7/1988 | Peek | 156/640 |
| 4,979,014 | 12/1990 | Hieda et al. | 357/56 |
| 5,029,321 | 7/1991 | Kimura | 357/24 |
| 5,051,798 | 9/1991 | Kimura | 357/24 |
| 5,086,010 | 2/1992 | Kimura | 437/53 |
| 5,114,865 | 5/1992 | Kimura | 437/2 |
| 5,200,353 | 4/1993 | Inuishi | 437/52 |
| 5,278,438 | 1/1994 | Kim et al. | 257/316 |

FOREIGN PATENT DOCUMENTS

| 59-181045 | 10/1984 | Japan |
| 1-276669 | 11/1989 | Japan |
| 2-125667 | 5/1990 | Japan |
| 4-061346 | 6/1990 | Japan |
| 2-263473 | 10/1990 | Japan |
| 4-68577 | 3/1992 | Japan |

*Primary Examiner*—George Fourson
*Assistant Examiner*—David Mason
*Attorney, Agent, or Firm*—Oliff & Berridge

[57] ABSTRACT

A projection is formed in a substrate by anisotropic etching and a transistor is contained in the projection. The central portion of the projection covered with a gate electrode is formed as a channel region, and drain and source regions are formed on both sides of the projection by oblique ion implantation with the gate electrode as a mask. Formed below the drain, source, and channel regions is an element isolation section having the composition of the substrate intact. This eliminates the need for an oxide insulating layer below the transistor for easy manufacturing. Carriers generated in the channel region by ionization by collision can also be discharged to the substrate.

5 Claims, 11 Drawing Sheets

MANUFACTURING METHOD FOR SEMICONDUCTOR DEVICES WITH SOURCE/DRAIN FORMED IN SUBSTRATE PROJECTION.

BACKGROUND OF THE INVENTION

1. Field of the Invention

This invention relates to a semiconductor device which is formed with elements such as MOS (metal oxide semiconductor) transistors in its semiconductor substrate.

2. Description of the Related Art

Hitherto, various semiconductor devices have been proposed, and particularly those containing MOS transistors are used widely. For such semiconductor devices, microminiaturization of the element structure is advanced to increase the degree to which the elements are integrated into the semiconductor device.

For many of conventional semiconductor devices, a number of MOS transistors are formed in a predetermined area of a flat semiconductor substrate, such as a silicon substrate. In this case, with a gate region covered with a gate electrode via an insulating thin layer, the regions on both sides of the gate region are doped with ions to form source and drain regions for making a MOS transistor in a predetermined area of a semiconductor substrate. Various problems will arise from microminiaturizing such MOS transistors of semiconductor devices: As an electric field around a drain increases, a drain depletion layer extends to near a potential barrier nearby a source, causing a punch through current to occur (short channel effect); as the electric field strength in an channel increases, carrier energy increases and electron-hole pairs are generated because of ionization by collision (hot carrier effect); and an electric field in the vertical direction of channel becomes large and the carrier mobility becomes small and isolation between adjacent elements becomes insufficient. Therefore, conventional semiconductor devices have a problem of an incapability of maintaining sufficient performance or reliability if the gate length is made submicron or less.

On the other hand, SOI (silicon on insulator) ultrathin film transistors are proposed to overcome these problems. The SOI ultrathin film transistor is formed on a silicon ultrathin film on an insulating film and source, gate, and drain regions are formed on the silicon ultrathin film. Since the ultrathin film transistor is formed on the silicon ultrathin film on the insulating film, the short channel effect and the hot carrier effect can be reduced and a potential in the entire channel can be controlled; resultantly, an electric field in the vertical direction can be made small to maintain large carrier mobility and excellent isolation between the elements can be provided.

However, because of its structure, the ultrathin film transistor requires formation of a silicon ultrathin film to form the transistor on the insulating film. Yet technologically it is very hard to form a single crystal layer of silicon on an insulating film, such as $SiO_2$. Particularly, a good epitaxial film of silicon cannot be formed at present and it is difficult to provide SOI ultrathin film transistors with desirable performance.

On the other hand, proposed as a semiconductor device which provides a similar effect to that of the SOI ultrathin film transistor is a vertical ultrathin film transistor with source, channel, and drain regions formed within an extremely thin projection on a silicon substrate. Specifically, the projection is formed on the silicon substrate by an isotropic etching, then field oxidation is executed with the projection covered with silicon nitride for isolating the silicon substrate and the projection from each other by a resultant field oxide layer. The projection can be formed as a single crystal of silicon and further the transistor is formed within the projection, thus the integration degree can be raised furthermore. Such a semiconductor device is described in, for example, Japanese Patent Laid-Open No. Hei 2-263473.

However, the vertical ultrathin film transistor requires that field oxidation should be executed with the projection covered with an oxidation-resistant film, such as $Si_3N_4$, to form a field oxide layer up to the bottom of the projection for isolating the channel section and substrate from each other, as described above. Therefore, in the field oxidation step, there is a risk of crystal being damaged in the channel section, and the transistor cannot be provided with enough performance. Further, since the channel section is isolated completely from other regions by the field oxide film, if ionization by collision occurs in the channel section, excess carriers of the same polarity stay here and potential shifts, causing various hindrances to occur. Since the field oxide layer is low in thermal conductivity, sufficient heat radiation cannot be accomplished. Further, since the oxide layer formed by field oxidation differs from a gate oxide film in properties, the residual stress on that oxide layer will be large.

SUMMARY OF THE INVENTION

Accordingly, it is an object of the invention to provide a semiconductor device whose operation performance is not degraded in microminiaturization.

Another object of the invention is to provide a manufacturing method for the semiconductor device.

To these ends, according to the invention, there is provided a semiconductor device which comprises a flat semiconductor substrate, an element formation section projected above the semiconductor substrate, an impurity-doped active area located in the element formation section, and an element isolation section located below the active area in the element formation section, the isolation section having the same composition as the semiconductor substrate.

Since elements such as transistors can be housed in the element formation sections, the elements can be made vertical to raise the integration degree. Since the element isolation section has the same composition as the substrate, the elements can operate like those formed on a normal substrate and a problem which may occur when elements are formed on an oxide does not arise.

In the semiconductor device of the invention, a channel part in the element formation section, namely projection width, is sufficiently narrow and channel carriers are formed within the projected element formation section as well as on its surface.

Therefore, the current density within the projection can be made constant for stabilizing transistor on/off operation.

The method of manufacturing the semiconductor device of the invention comprises the steps of forming a plurality of grooves in a semiconductor substrate by anisotropic etching to form a projection, and while leaving a region with no impurity doped in the lower part of the formed projection, introducing an impurity into the upper part of the projection to form impurity-doped regions.

Thus, an impurity can be introduced only into the upper part of each projection to manufacture a semiconductor device which accommodates elements such as transistors within the projections. This eliminates the need for a field oxidation step for element isolation and can prevent the silicon crystal from being degraded in a manufacturing process. Further, the manufactured elements are vertical and the integration degree can be raised. In addition to ion implantation, impurity diffusion from a vapor or solid phase is available as impurity introducing methods.

In the impurity introducing step, oblique ion implantation is executed with an opposite wall set apart by one of the grooves as a mask. Thus, ion implantation can be executed into predetermined regions without requiring any special steps.

The impurity introducing step also includes a filling step where the bottoms of the grooves formed are filled with mask material for forming the impurity-doped regions in the upper part of the projection while leaving the area with no impurity doped in the lower part with the grooves filled with the mask material, so that ion implantation can be executed into predetermined regions in the projection.

According to another embodiment of the invention, there is provided a semiconductor device which comprises a flat semiconductor substrate, a plurality of element formation sections projected above the semiconductor substrate, an active area located in each of the element formation sections, an impurity of a first conductivity type being injected into the active area, and an element isolation section located below the active area in each of the element formation sections, the isolation section having the same composition as the semiconductor substrate, wherein an impurity of a second conductive type is injected around the substrate surface existing between the element formation sections.

Thus, an impurity of the opposite conductivity type to the impurity injected into drain and source regions is injected around the surface of the substrate existing between the element formation sections. When the drain and source regions are formed by oblique ion implantation, even if some of impurity atoms are reflected by the side wall of the projection into which the impurity is to be ion-implanted, and are injected around the substrate surface existing between the projections, no parasitic MOS transistors are generated around the substrate surface.

The method of manufacturing the semiconductor device according to the invention comprises the steps of:

forming a plurality of grooves in a semiconductor substrate by anisotropic etching to form a projection;

injecting into the bottom of each of the grooves an impurity of a second conductivity type different from an impurity of a first conductivity type injected into an active area formed in the projection (first impurity introducing step); and while leaving an area with no impurities doped in the lower part of the formed projection, injecting an impurity of the first conductivity type into the upper part of the projection to form impurity-doped regions which become active regions (second impurity introducing step).

Before the impurity introducing step of executing oblique ion implantation to form the drain and source regions, an impurity of a conductivity type different from that of the impurity injected into the drain and source regions is injected around the substrate surface existing between the element formation sections, namely, is injected into each of the grooves formed on the semiconductor substrate by anisotropic etching. Even if some of the impurity atoms are reflected by the side wall of the projection into which the impurity is to be ion-implanted, and are injected into the groove, the concentration of the impurity of the conductivity type different from that of the impurity injected into the drain and source regions is higher, thus charge is neutralized and no parasitic MOS transistor is generated in the portion.

BRIEF DESCRIPTION OF THE DRAWINGS

In the accompanying drawings:

FIGS. 13A, 13B and 13C provide diagrams to use the semiconductor device of the invention as an inverter, wherein FIG. 13A is a section view, FIG. 13B is a plane view and FIG. 13C is a circuit diagram.

DESCRIPTION OF THE PREFERRED EMBODIMENTS

Now, preferred embodiments of the invention are described in conjunction with the accompanying drawings.

Figure 1:
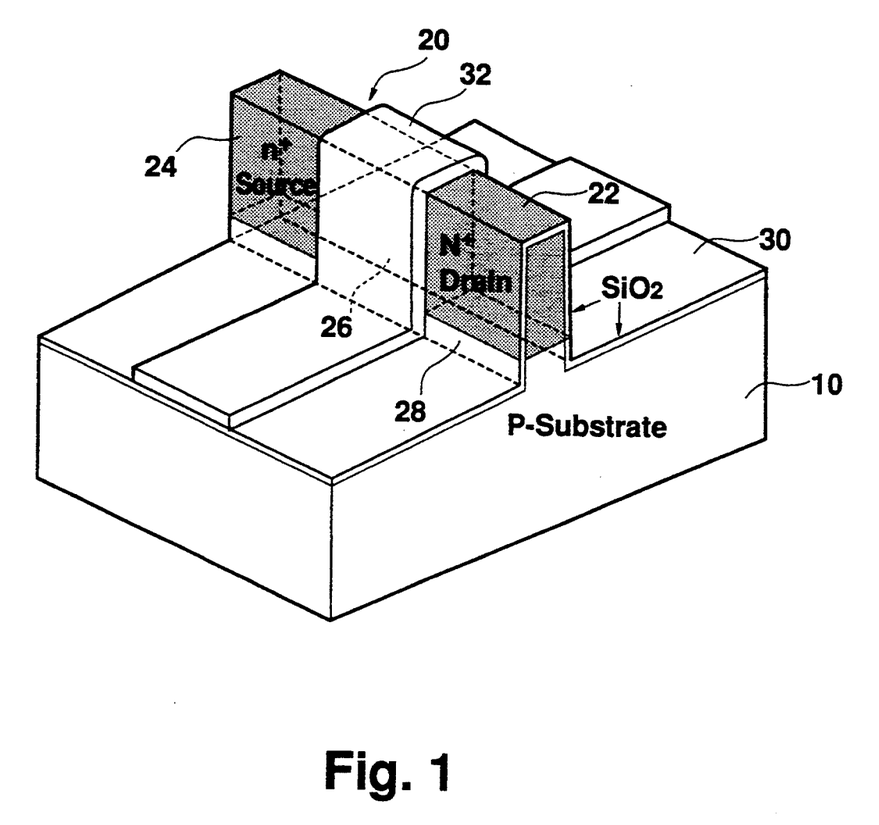
FIG. 1 is a perspective view showing the structure of a semiconductor device according to a first embodiment of the invention.

FIG. 1 is a perspective view for illustrating the structure of a semiconductor device according to a first embodiment of the invention, wherein a projection 20 is formed in the top of a p-type silicon substrate 10. An $n^+$-type drain region 22 and an $n^+$-type source region 24 are formed in both sides of the projection 20 and a p-type channel region 26 of the same polarity as the substrate 10 is formed in an area put between the drain region 22 and the source region 24. The lower ends of the drain region 22, source region 24, and channel region 26 are housed within the projection 20 and an element isolation part 28, a part of the substrate 10, is formed in the bottom of the projection 20.

All the surfaces of the substrate 10 and the projection 20 are covered with an oxide film 30 made of $SiO_2$ and a gate electrode 32 is formed on the surface of the channel region 26. Thus, the oxide film 30 functions as a gate oxide film. The gate electrode 32 is drawn out to a predetermined end of the substrate 10 for electric connection to another device.

The semiconductor device of the embodiment is formed with one MOS transistor within the projection 20. Therefore, if a drain electrode and a source electrode are connected to the drain region 22 and the source region 24 respectively, a voltage can be applied to the gate electrode 32 for controlling potential of the channel region 26 and a current from the drain region 22 to the source region 24. Since the MOS transistor formed is an n channel in the example, a current flows by applying a positive voltage to the gate electrode.

Particularly, the semiconductor device of the embodiment is formed with the element isolation part 28 at the bottom of the projection 20 for substantially complete isolation between adjacent elements; the isolation part 28 is a part of the substrate 10. Then, excess carriers of the same polarity as the substrate which are generated by ionization by collision (in this case, holes) are discharged to the substrate 10 and do not stay in the channel region 26. Therefore, a kink phenomenon accompanying accumulation of excess carriers does not occur and a pseudo short channel effect caused by excess holes does not occur either. Since heat generated by power consumption is easily radiated to the substrate 10, heating the channel region 26 can be prevented.

Further, since the transistor is made vertical and the channel region 26 is surrounded by the gate electrode 32, potential of the entire channel region can be controlled to a predetermined value to perform a SOI ultrathin transistor operation and operation performance can be made very high.

When the distance between the opposite side surfaces of channel region is smaller than depletion layer to be expanded within channel region by gate field effect, SOI ultrathin film transistor operation can be acquired.

Namely, when channel surfaces' state become strong inversion state as the gate electrode is biased, inner part of the channel region is depleted and can be fully inverted.

Therefore, short channel effect and the lowering of carrier mobility can be prevented.

Figure 2:
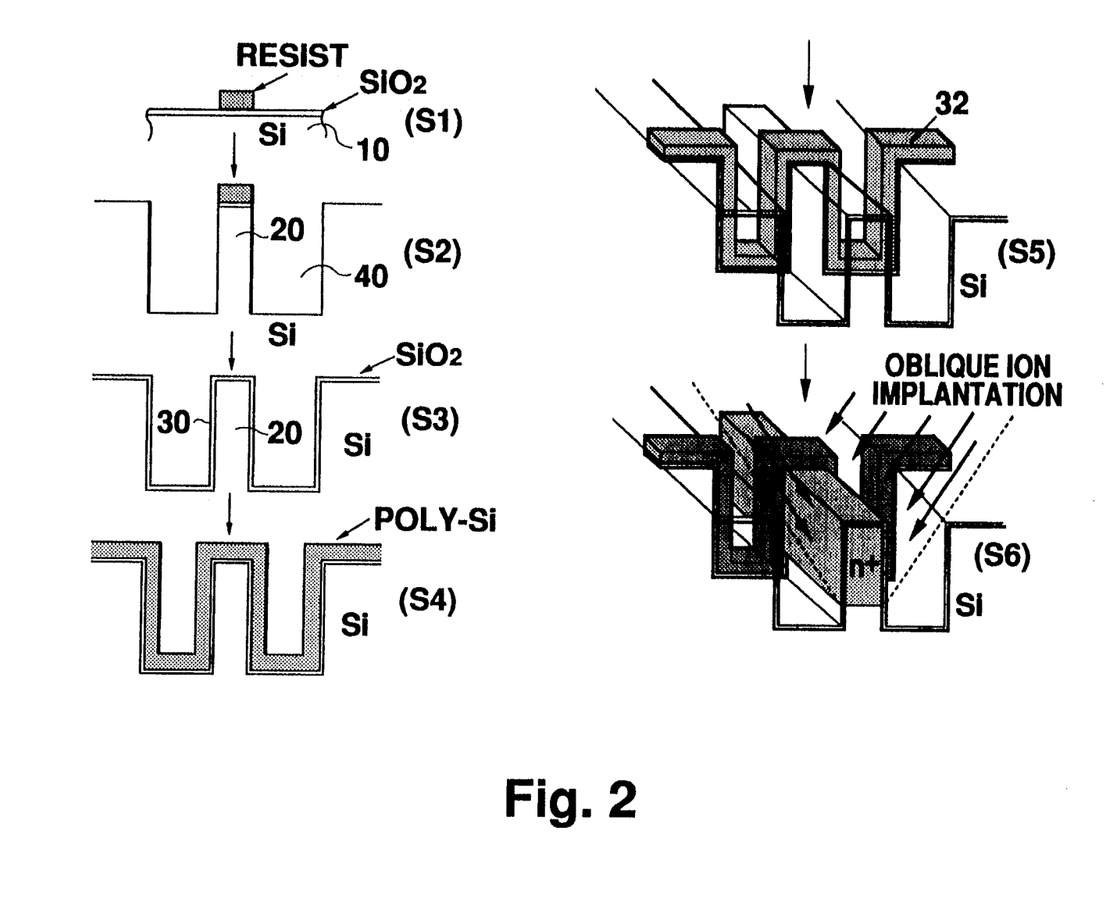
FIG. 2 illustrates manufacturing steps of the semiconductor device of the first embodiment.

Next, the manufacturing method for the semiconductor device of the first embodiment is described in conjunction with FIG. 2. First, at step S1, an $SiO_2$ layer is formed on the surface of a substrate 10 made of a single crystal of silicon by thermal oxidation and a line pattern having a line width of about 0.1 μm (resist film) is formed on the $SiO_2$ layer by an ultramicro patterning technique using an electron beam exposure system, a multilayer resist exposure technique, etc. Then, at step S2, with the resist line pattern as a mask, the substrate 10 is anisotropically etched by RIE (reactive ion etching), etc., to form predetermined recesses 40 for providing a projection 20. Next, at step S3, the resist pattern is removed and the full surface of the substrate 10 is oxidized to form an $SiO_2$ oxide film 30. At step S4, a polysilicon layer Poly-Si is formed on the full surface of the oxide film, then at step S5 a gate electrode 32 is formed by normal masking and etching. It is formed by using an ECR etching system and a highly anisotropic, highly selective etching technique such as a neutral radical beam etching.

Figure 3:
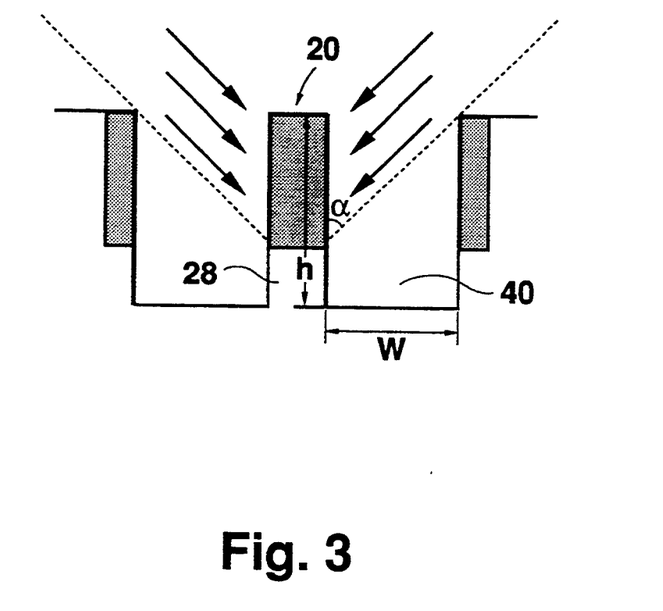
FIG. 3 illustrates an oblique ion implantation step.

Upon completion of formation of the projection 20 and the gate electrode 32 via the gate oxide film on the surface of the projection as described above, then a drain region 22 and a source region 24 are formed by ion implantation at step S6 (in the embodiment, the n+ regions are formed by ion-implanting, for example, phosphorus). The ion implantation is executed by an obliquely incident ion implanter for limiting the ion radiation direction only to the oblique direction. As shown in FIG. 3, ion radiation angle $\alpha$ and width of the recess 40, w, are determined so that the relation of $\tan\alpha > w/h$ is maintained by assuming that the height of the projection 20 is h. Therefore, the side wall of the recess 40 functions as a mask and an element isolation part 28 having the same composition as the p substrate into which no ions are implanted remains on the substrate side of the projection 20. The ion implantation step is followed by a thermal diffusion step by heating at which the drain region 22 and the source region 24 are enlarged slightly. Then, this point should also be considered to determine the size of the element isolation part 28.

Thus, a MOS transistor isolated from the substrate can be formed by means of the isolation part 28 within the projection 20. Actual operation of the MOS transistor requires a source electrode, a drain electrode, an interlayer insulating layer, an Al wiring layer, a protective layer, etc., which are then formed by a general method for enabling the semiconductor device to operate.

According to the embodiment, the element isolation part 28 is formed simply by leaving the substrate 10 as it is. This eliminates the need for forming an oxide layer for element isolation, as with SOI ultrathin transistors, between the MOS transistor and substrate, thereby simplifying the manufacturing process. Therefore, the projection 20 can be made of a good single crystal of silicon, because steps having severe conditions such as a field oxidation step where the volume and structure are drastically changed, are not required; this can prevent formation of parts in which large stress remains, such as contacts of a gate oxide film with a field oxide film.

Figure 4:
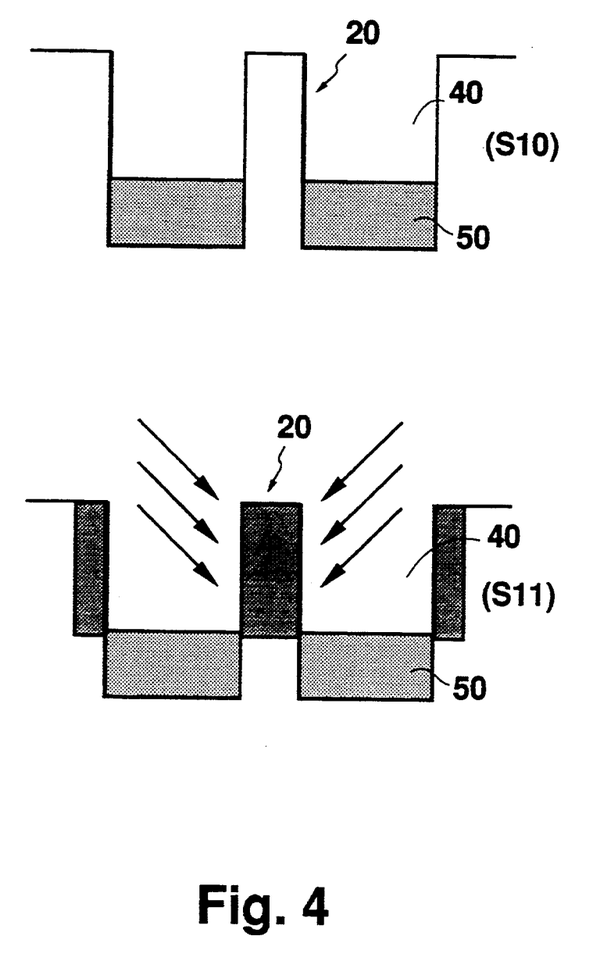
FIG. 4 illustrates manufacturing steps of a semiconductor device according to a second embodiment of the invention.

Next, FIG. 4 shows the manufacturing method for a semiconductor device according to a second embodiment of the invention. This example has a filling step with a filler (S10) preceding the step S6 in FIG. 2 shown above. At the filling step, a recess 40 is filled with a predetermined amount of filler before oblique ion implantation is executed at step S11. Therefore, the filler blocks ion implantation into the lower part of a projection, and even if the recess 40 is widened, an element isolation part can be formed in the lower part of the projection. The width of the recess 40 can be selected as desired and the oblique ion implantation accuracy need not be set so much high for easy manufacturing. Preferably, the filler is an insulating material such as $SiO_2$ or SiN.

Next, a semiconductor device according to a third embodiment of the invention is described. In the first embodiment, when the drain and source regions are formed by oblique ion implantation with the gate electrode as a mask, some of impurity atoms may be reflected by the side wall of the projection into which the impurity is to be ion-implanted. In this case, the reflected impurity atoms are ion-implanted around the substrate surface existing between the projections, resulting in incomplete isolation between the element formed in one projection and the element in its adjacent projection. Since ions are implanted into the substrate surface existing between the projections, a parasitic MOS transistor is generated under a gate electrode, if present at the surface, and good transistor characteristics are not provided.

Figure 5:
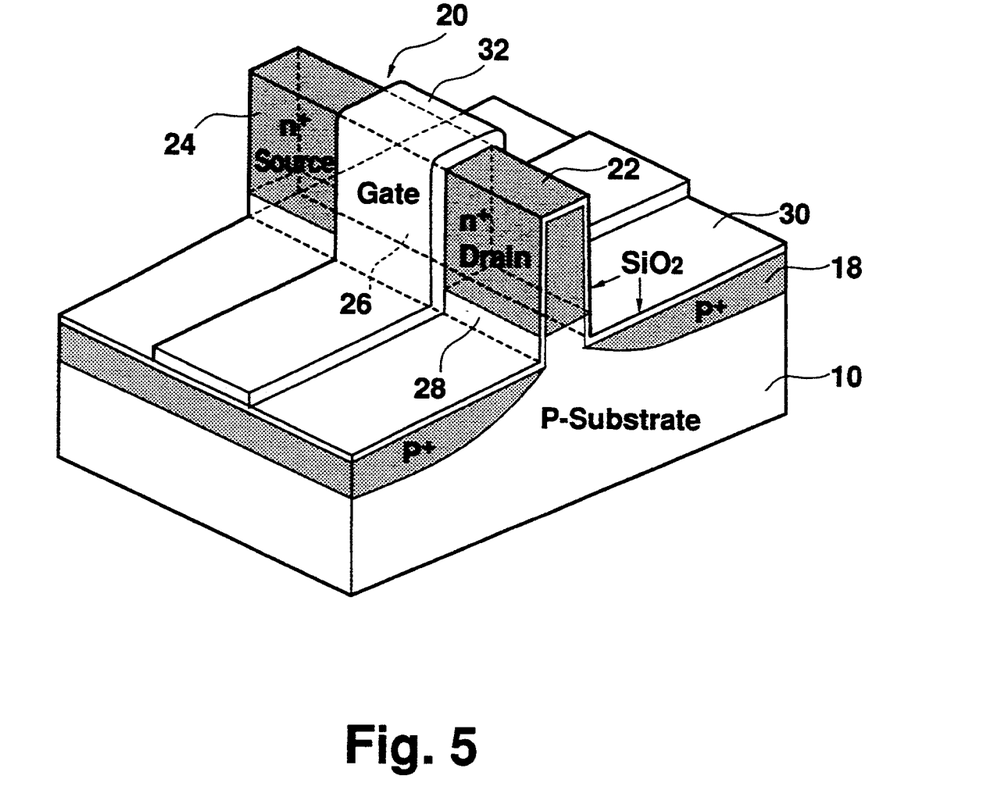
FIG. 5 is a perspective view showing the structure of a semiconductor device according to a third embodiment of the invention.

To solve these problems, a semiconductor device is provided according to the third embodiment of the invention. FIG. 5 is a perspective view for illustrating the structure of the semiconductor device of the third embodiment. In the figure, only one of projections is shown.

In the third embodiment, an opposite conductivity type impurity layer 18 into which an impurity of opposite conductivity type is injected is formed around the surface of a substrate 10 existing between projection 20 and its adjacent projection. That is, when a drain region 22 and a source region 24 are n type, a p+-type impurity, such as boron (B), is injected into the opposite conductivity type impurity layer 18 formed around the surface of the substrate 10 existing between projection 20 and its adjacent projection; when the drain and source regions are p type, an n+-type impurity, phosphorus, is injected into the impurity layer 18. This enables substantially complete isolation between adjacent elements.

Figure 6:
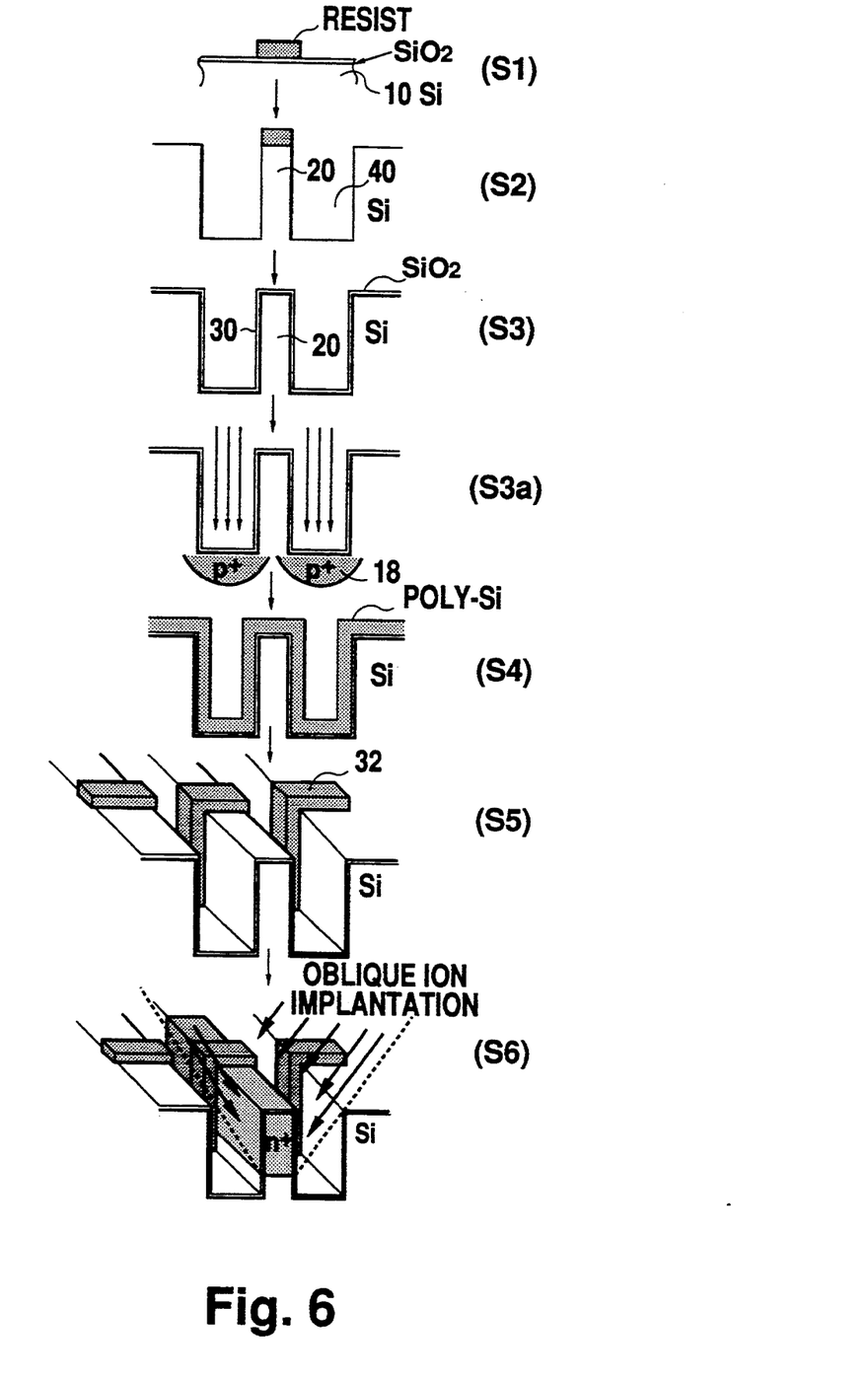
FIG. 6 illustrates manufacturing steps of the semiconductor device of the third embodiment.

Next, the manufacturing method for the semiconductor device of the third embodiment is described in conjunction with FIG. 6. At step S3a following S3, an impurity of the opposite conductivity type to the impurity to be injected into the drain and source regions, (in the embodiment, a p+-type impurity, such as boron (B)), is injected into the bottom of a groove between projection 20 and its adjacent projection in the vertical direction to the groove to form an opposite conductivity type impurity layer 18.

Even if some of impurity atoms for forming source and drain regions are reflected by the side wall of the projection 20 and are injected into the bottom of the groove at step S6 (ion implantation), charge can be neutralized by means of the p+-type conductive impurity layer 18; no n channel is formed in the bottom of the groove and no parasitic MOS transistor is generated. When the concentration of the reflected n-type impurity is higher than the p+-type impurity concentration in the opposite conductivity type impurity layer 18, the p+-type conductive impurity layer 18 does not remain in the substrate 10 after completion of all steps. But if the concentration of the reflected n-type impurity is equal to or lower than the p+-type impurity concentration in the opposite conductivity type impurity layer 18, the amount of the reflected n-type impurity exceeds that of the previously injected p-type impurity, thus the p+-type conductive impurity layer 18 remains in the manufactured semiconductor device, and no n channel is formed in the bottom of the groove and no parasitic MOS transistor is generated.

Figure 7A:
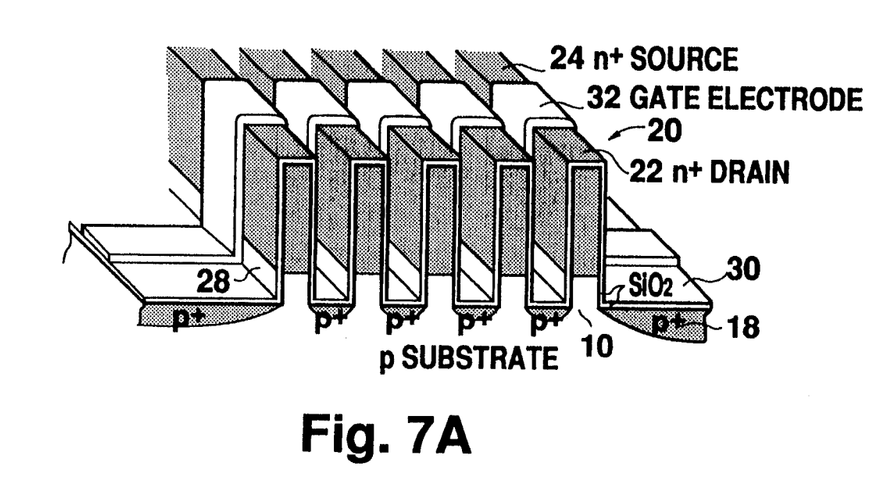
FIGS. 7A and 7B are views showing the structure of a semiconductor device according to a fourth embodiment of the invention, wherein 7A is a perspective view and 7B is a section view.
Figure 7B:
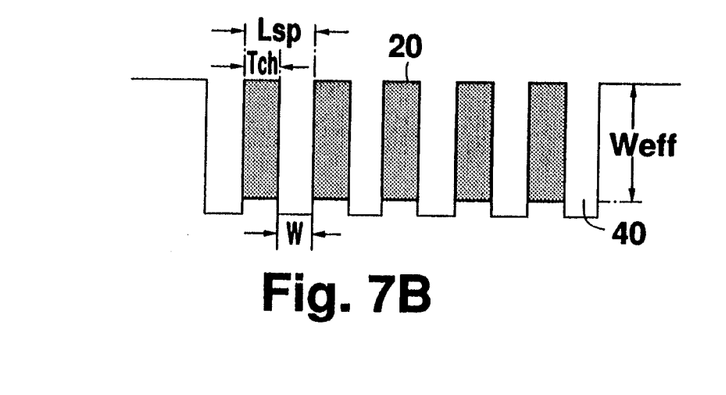

FIGS. 7A and 7B are views showing the structure of a semiconductor device according to a fourth embodiment of the invention, wherein a large number of projections 20 are spaced at predetermined intervals. Since effective channel width Weff can be made wider than width of projection 20, Tch in the embodiment, effective channel width per unit width Lsp, can be made very high. Particularly in the example, Tch and W can be made both substantially 0.1 μm and the element integration degree can be increased drastically. In the example, one gate electrode 26 (not shown) is common to the transistors of the projections 20.

An impurity of the opposite conductivity type to the impurity injected into drain and source regions is injected around the surface of substrate existing between element formation sections in the embodiment. When drain and source regions are formed by oblique ion implantation, even if some of impurity atoms are reflected by the side wall of the projection into which the impurity is to be ion-implanted, and are injected around the substrate surface existing between the projections, the area around the substrate surface does not become a channel.

Figure 8:
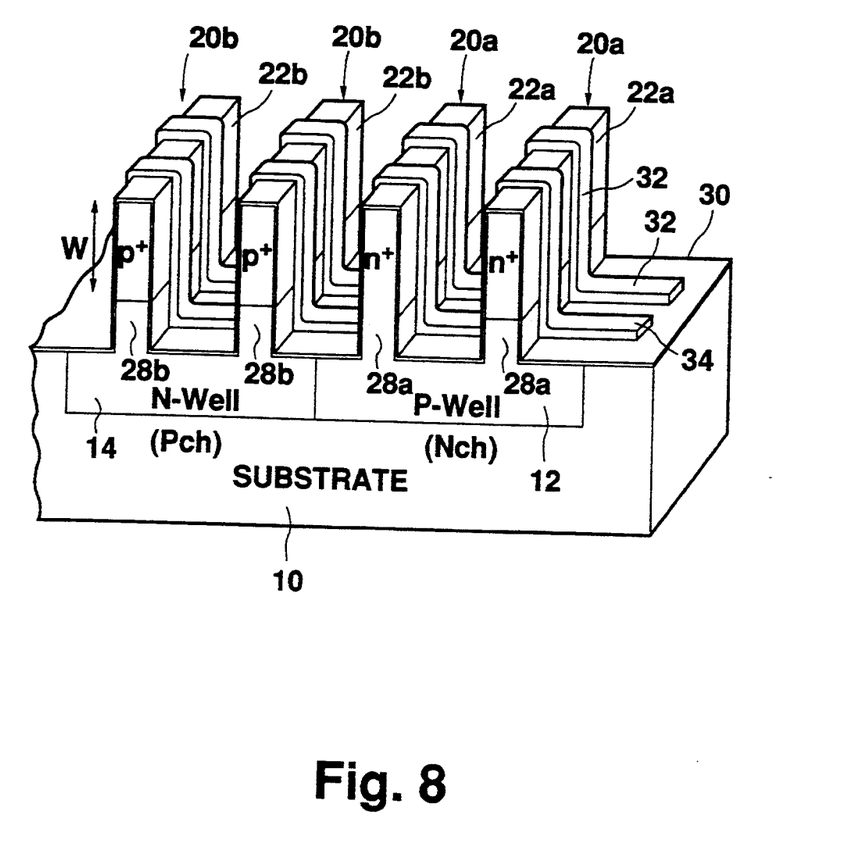
FIG. 8 is a perspective view showing the structure of a semiconductor device according to a fifth embodiment of the invention.
Figure 9:
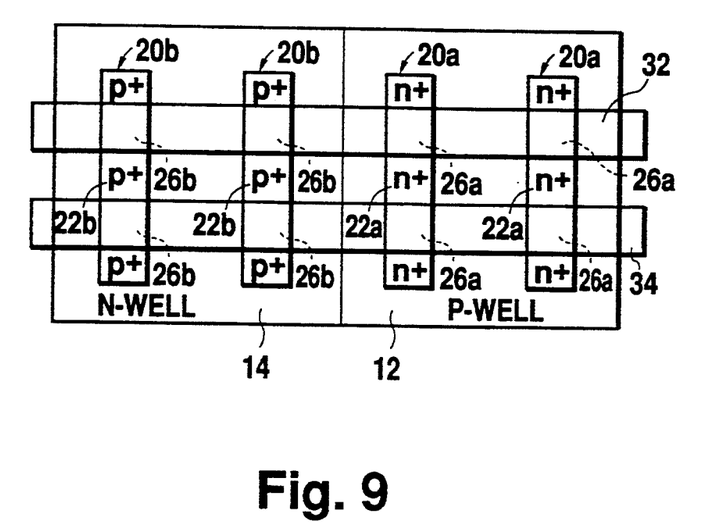
FIG. 9 is a plan view of the semiconductor device of the fifth embodiment.

Next, the structure of a semiconductor device according to a fifth embodiment of the invention is described. FIGS. 8 and 9 show a perspective view and a plan view of the semiconductor device of the fifth embodiment respectively. A p-well 12 and an n-well 14 are formed on the top of a silicon substrate 10 by doping a predetermined impurity. The wells 12 and 14 are formed each with two projections 20a and 20b respectively. The projections 20a are formed each with three n+-type regions 22a which function as drain or source regions. A p-type channel region 26a of the same polarity as the p-well 12 is formed in an area put between the n+-type regions 22a.

On the other hand, the projections 20b are formed each with three p+-type regions 22b which function as drain or source regions. An n-type channel region 26b of the same polarity as the n-well 12 is formed in an area put between the p+-type regions 22b.

The lower ends of the n+-type regions 22a and the p+-type regions 22b are housed within the projections 20a and 20b, and element isolation parts 28a and 28b, parts of the p-well and n-wells 12 and 14, are formed on the bottoms of the projections 20a and 20b.

All the surfaces of the p-well and n-wells 12 and 14 and the projections 20a and 20b are covered with an oxide film 30 made of SiO2 and the surfaces of the channel regions 26a and 26b are covered with gate electrodes 32 and 34 respectively. Thus, the oxide film 30 functions as a gate oxide film. The gate electrodes 32 and 34 are drawn out along the surfaces of the four projections 20a and 20b to a predetermined end of the substrate 10 for electric connection to an another device.

Figure 10:
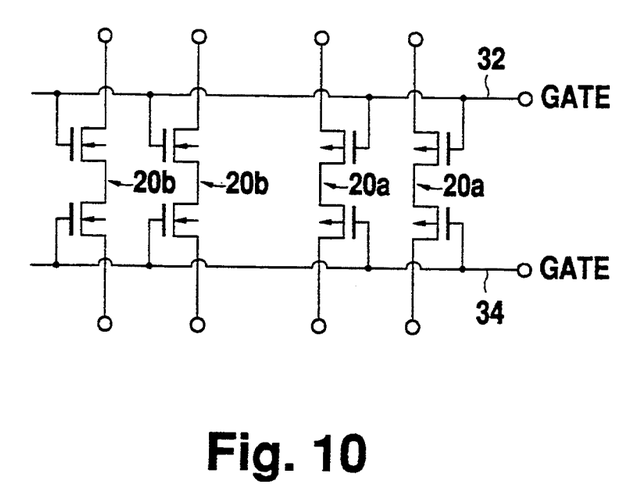
FIG. 10 is a circuit diagram of the semiconductor device of the fifth embodiment.

If wires are led from the opposite ends of each of the n+-type region 22a and p+-type region 22b of the semiconductor device, the circuit becomes as shown in FIG. 10. Desired wires can be connected to build an inverter, AND gate, etc. These basic cells can be integrated in one substrate 10 to form a gate array or the like. The semiconductor device of the embodiment is formed with two MOS transistors in one projection 20 and two projections 20 each in the p-well and n-wells 12 and 14 to integrate MOS transistors at high degree.

Figure 13A:
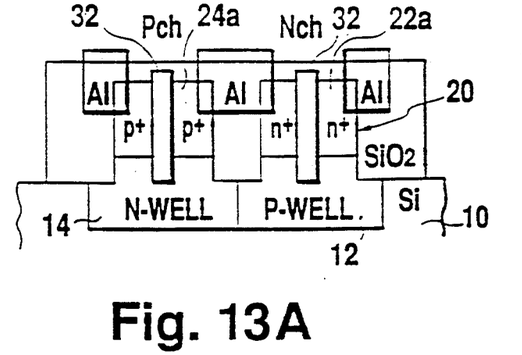
Figure 13B:
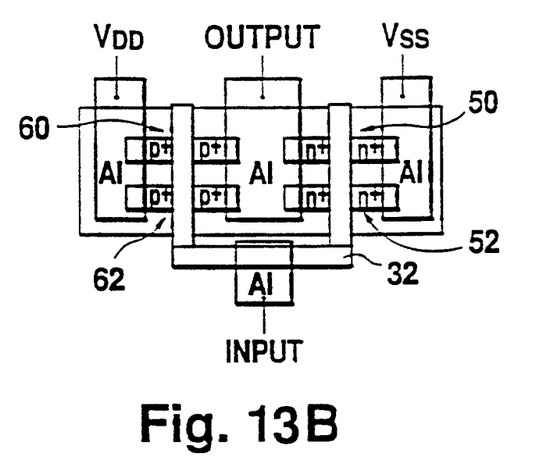
Figure 13C:
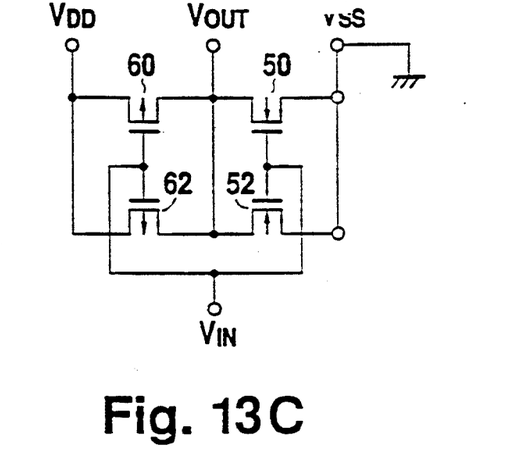

FIGS. 13A, 13B and 13C show an example of using the semiconductor device of the invention as an inverter. This example circuit has two n-type transistors 50 and 52 and two p-type transistors 60 and 62. The transistors 50 and 60 and the transistors 52 and 62 are disposed between supply voltage VDD and ground. Vin is input to the gates of all the transistors 50, 52, 60, and 62 and Vout is output from the connection point of the transistors 50 and 60 and that of the transistors 52 and 62. Therefore, if Vin is high, the two n-type transistors 50 and 52 are turned on, causing Vout to go low; if Vin is low, the two p-type transistors 60 and 62 are turned on, causing Vout to go high. That is, the circuit shown in FIGS. 13A, 13B and 13C; serves as an inverter. In the example shown in FIGS. 13A, 13B and 13C, each projection 20 contains one MOS transistor.

Figure 11:
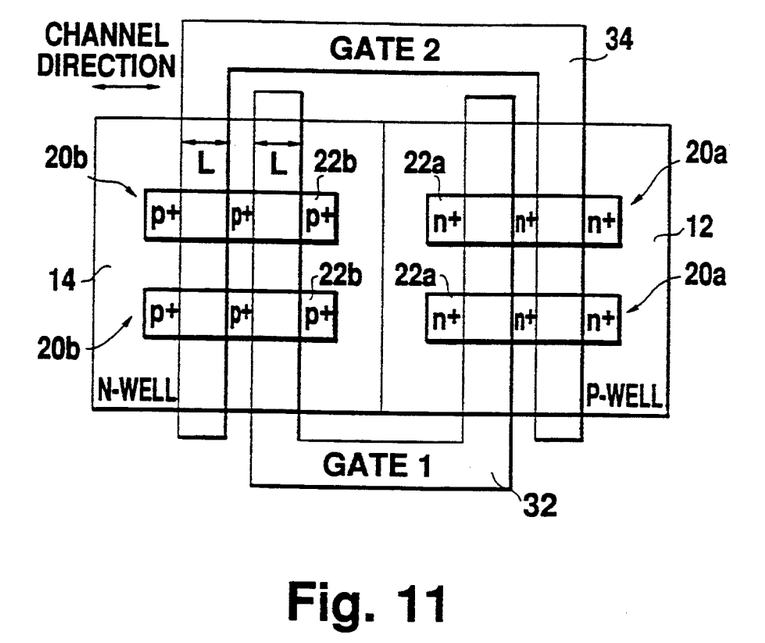
FIG. 11 is a plan view of a semiconductor device according to a sixth embodiment of the invention.
Figure 12:
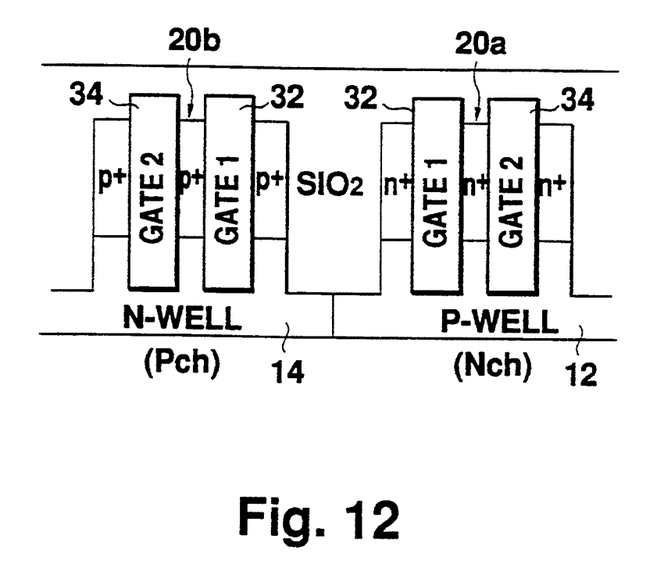
FIG. 12 is a sectional view of the semiconductor device of the sixth embodiment of the invention.

FIGS. 11 and 12 show a plan view and a sectional view of a semiconductor device according to a sixth embodiment of the invention respectively. This embodiment differs from the fifth embodiment in orientation of projection 20, that is, a gate electrode 32 extends in the direction perpendicular to the direction in which the p-well 12 and n-well 14 are arranged, thus the embodiments differ only in how to draw out the gate electrodes 32 and 34. Since efficient wiring can be made by changing orientation as described above, two types of arrangements may be mixed within one semiconductor or may be unified into one type.

The semiconductor device according to the fifth and sixth embodiments of the invention is formed with two or more element parts within one well for improvement of the degree.

What is claimed is:

1. A method of making a semiconductor device which includes at least one projection formed on a substrate having a conductivity type, the at least one projection including at least one vertical MOS transistor having a channel region, a source region and a drain region, the method comprising the steps of:
   (1) forming a plurality of grooves in the semiconductor substrate by anisotropic etching to form the at least one projection, the at least one projection having a top surface extending in a longitudinal direction;
   (2) forming a gate insulating film on the outer surface of the at least one projection;
   (3) forming a gate electrode on said gate insulating film extending entirely across a portion of the top of and a portion of sidewalls of the at least one projection perpendicular to the longitudinal direction; and
   (4) introducing an impurity of the opposite conductivity type from the conductivity type of the substrate into an upper part of said at least one projection to form the source region and the drain region while leaving an isolation region with no impurity doped in a lower part of the at least one projection between the upper part of the at least one projection and the substrate, wherein a height of the upper part of said at least one projection is greater than a height of the lower part of said at least one projection.

2. The method as claimed in claim 1 wherein said impurity introducing step includes using oblique ion implantation with an opposite wall set apart by one of said grooves as a mask to form the source region and the drain region in the upper part of said at least one projection while leaving the region with no impurity doped in the lower part of said at least one projection.

3. The method as claimed in claim 1 wherein said impurity introducing step includes:
   filling bottoms of said plurality of grooves formed at said groove forming step with a mask material; and
   blocking the impurity from doping the isolation region in the lower part of said at least one projection with the mask material to form the impurity-doped regions in the upper part of said at least one projection while leaving the isolation region with no impurity doped in the lower part of said at least one projection.

4. The method as claimed in claim 1 further comprising the additional step of introducing into the bottoms of said grooves formed at said groove forming step an impurity of an opposite conductivity type from the impurity introduced at said impurity introducing step into said at least one projection.

5. The method as claimed in claim 4 wherein said impurity introducing step into said groove bottoms is executed before said impurity introducing step into said at least one projection.

* * * * *